(12) United States Patent
Horiuchi

(10) Patent No.: US 10,529,582 B2
(45) Date of Patent: Jan. 7, 2020

(54) PLASMA ETCHING METHOD AND METHOD OF FABRICATING SEMICONDUCTOR DEVICE

(71) Applicant: TOSHIBA MEMORY CORPORATION, Minato-ku, Tokyo (JP)

(72) Inventor: Mitsunari Horiuchi, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/909,315

(22) Filed: Mar. 1, 2018

(65) Prior Publication Data
US 2019/0080923 A1 Mar. 14, 2019

(30) Foreign Application Priority Data
Sep. 11, 2017 (JP) ................. 2017-174112

(51) Int. Cl.
*H01L 21/311* (2006.01)
*H01L 21/3065* (2006.01)
*H01L 21/3213* (2006.01)
*H01J 37/32* (2006.01)
*H01L 21/768* (2006.01)

(52) U.S. Cl.
CPC .... *H01L 21/31116* (2013.01); *H01J 37/3244* (2013.01); *H01L 21/3065* (2013.01); *H01L 21/31144* (2013.01); *H01L 21/32137* (2013.01); *H01L 21/76802* (2013.01); *H01J 2237/334* (2013.01)

(58) Field of Classification Search
CPC ......... H01L 21/31116; H01L 21/76802; H01L 21/32137; H01L 21/31144; H01L 21/3065; H01J 2237/334; H01J 37/3244
USPC ....... 438/706, 710, 712, 714, 717, 719, 723, 438/736, 758
See application file for complete search history.

(56) References Cited

U.S. PATENT DOCUMENTS

| | | | |
|---|---|---|---|
| 9,034,198 B2 | 5/2015 | Nakagawa et al. | |
| 2003/0013313 A1* | 1/2003 | Negishi | H01L 21/02063 438/706 |
| 2013/0328173 A1* | 12/2013 | Fuller | H01L 21/30655 257/622 |
| 2014/0077126 A1* | 3/2014 | Benson | H01L 21/31116 252/79.1 |
| 2017/0178923 A1* | 6/2017 | Surla | H01L 21/31116 |

FOREIGN PATENT DOCUMENTS

| | | |
|---|---|---|
| JP | H4-170026 A | 6/1992 |
| JP | 2017-050529 A | 3/2017 |

* cited by examiner

*Primary Examiner* — Lan Vinh
(74) *Attorney, Agent, or Firm* — Foley & Lardner LLP

(57) ABSTRACT

A plasma etching method includes performing a plasma etching using a gas containing $C_2F_4$. An emission intensity of $CF_2$ is equal to or more than 3.5 times an emission intensity of $C_2$ while generating plasma.

17 Claims, 6 Drawing Sheets

PLASMA ETCHING METHOD AND METHOD OF FABRICATING SEMICONDUCTOR DEVICE

CROSS-REFERENCE TO RELATED APPLICATION

This application claims the benefit of and priority to Japanese Patent Application No. 2017-174112, filed Sep. 11, 2017, the entire contents of which are incorporated herein by reference.

FIELD

An embodiment described herein relates generally to a plasma etching method and a method of fabricating a semiconductor device.

BACKGROUND

In a semiconductor device, a groove may be formed in an insulating film by etching to form wiring patterns in the groove. In a case where an aspect ratio of the insulating film is high, a gas containing carbon (C) and fluorine (F) may be used as the etching gas. Improvements in a patterning method using such an etching gas are desired.

DETAILED DESCRIPTION

When an aspect ratio of an insulating film is high, a gas containing carbon (C) and fluorine (F) may be used as the etching gas. In a patterning method using such an etching gas, a groove formed in the insulating film is desirably formed to have a high perpendicularity.

An exemplary embodiment provides a plasma etching method by which a hole having a high perpendicularity can be formed and a method of fabricating a semiconductor device.

In general, according to some embodiments, a plasma etching method uses a gas containing $C_2F_4$, in which an emission intensity of $CF_2$ equal to or more than 3.5 times the emission intensity of $C_2$ while generating plasma.

Hereinafter, an exemplary embodiment of the present disclosure will be described with reference to the drawings.

The drawings are given schematically and conceptually, and a relation between thickness and width of the respective portions and a ratio of sizes between the portions are not illustrated in the exactly actual size. Even in a case where the same portion is illustrated, the dimension and the ratio may be differently illustrated depending on the drawings.

In the specification and the drawings of this application, corresponding elements are given the same reference signs as those in the already-described drawings, and the detailed description will be appropriately omitted.

Figure 1:
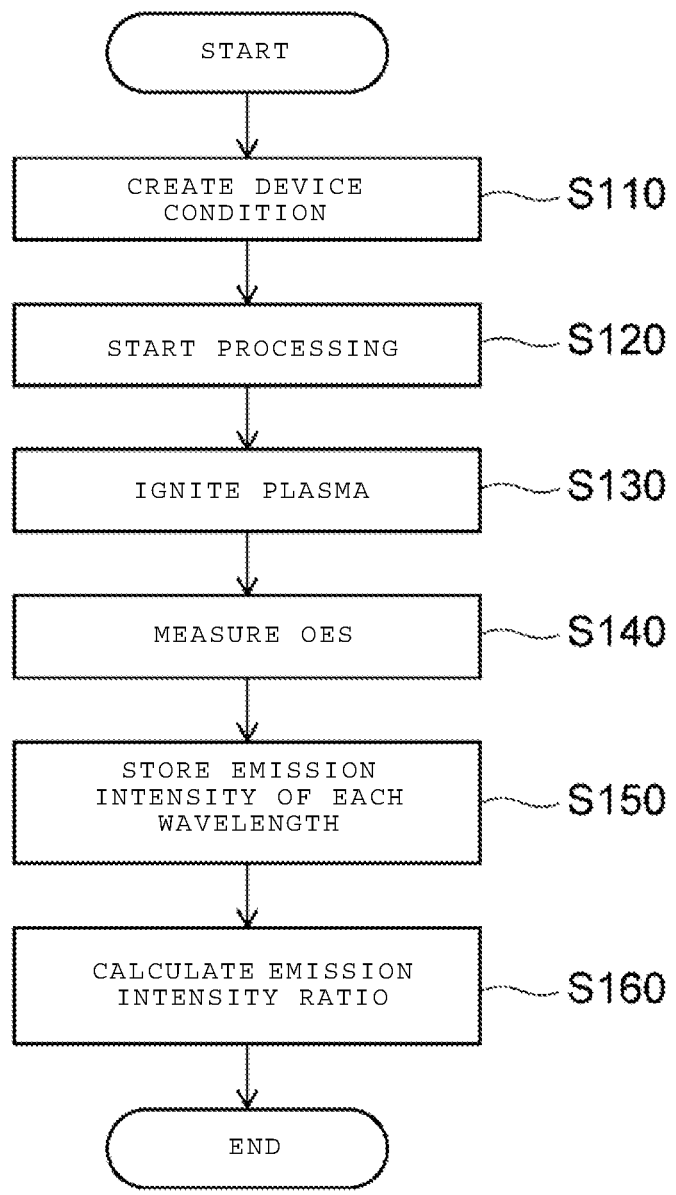
FIG. 1 is a flowchart illustrating a plasma etching method according to some embodiments.

FIG. 1 is a flowchart illustrating a plasma etching method according to some embodiments.

Figure 2:
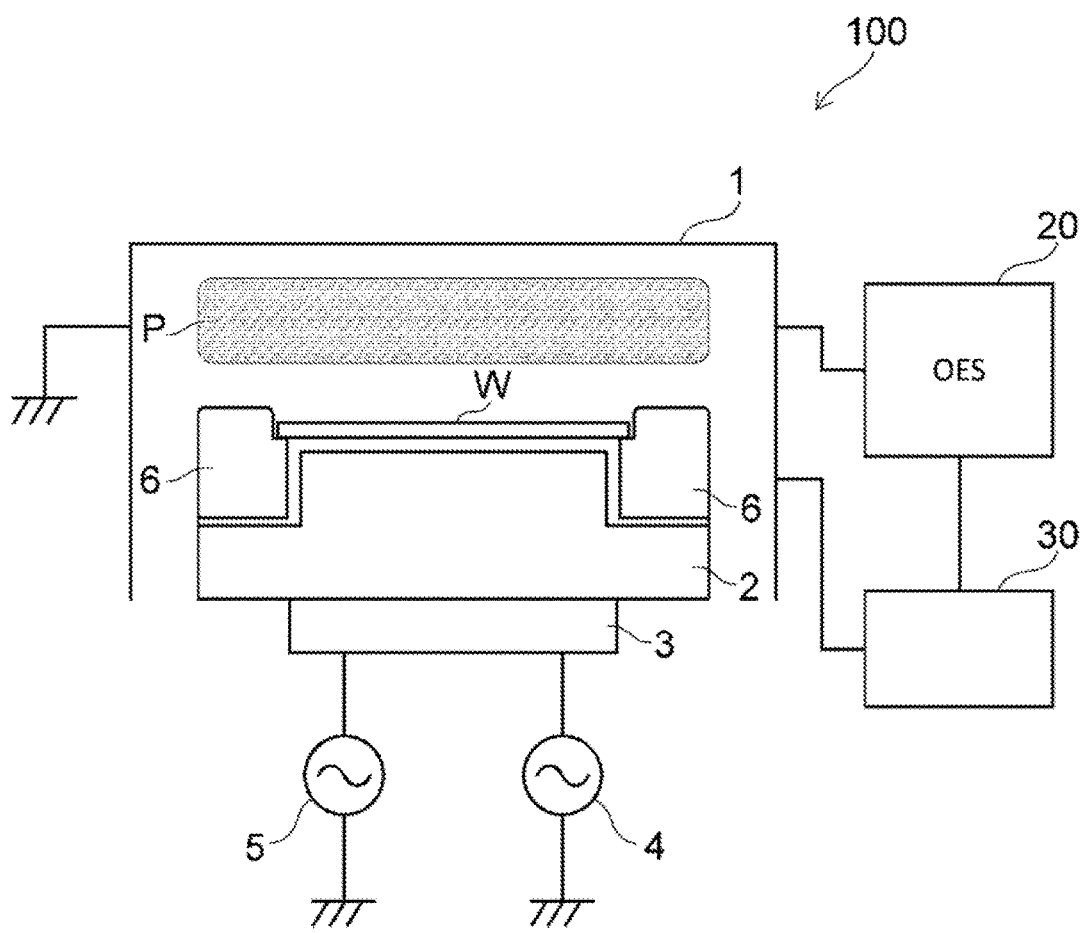
FIG. 2 is a diagram illustrating a plasma processing device according to some embodiments.

FIG. 2 is a diagram illustrating a plasma processing device according to some embodiments.

A method of forming an opening in a workpiece film on a substrate using a mask by the plasma etching will be described as an example. The workpiece film may be an insulating film, and may include a silicon oxide, for example. The workpiece film may be formed using TEOS (tetraethoxysilane) as a raw material. A carbon film may be formed on the workpiece film as an etching mask, for example.

As illustrated in FIG. 1, a device condition of a processing device is created (Step S110). The device condition may be the setting of a parameter which affects on the etching of an insulating film. The processing device may be a plasma processing device.

Herein, an exemplary configuration of a plasma processing device 100 will be described.

As illustrated in FIG. 2, the plasma processing device 100 is provided with a chamber 1, a lower electrode 2, a matching device 3, a first power source 4, a second power source 5, a holding portion 6, an analysis unit (or an analyzer) 20, and a calculation unit 30. A wafer W containing the substrate may be held by the holding portion 6 in the chamber 1.

The lower electrode 2 may be connected to the first power source 4 and the second power source 5 via the matching device 3. For example, the first power source 4 is a high-frequency power source of 100 MHz, and the second power source 5 is a high-frequency power source of 400 KHz. For example, the frequency of the first power source 4 is set higher than that of the second power source 5 so that the plasma processing device 100 can apply duel frequencies to the lower electrode.

The matching device 3 may be a matching box that matches impedance. In some embodiments, with the matching of the matching device 3, the superimposed power is applied from the first power source 4 and the second power source 5 to the lower electrode 2.

As illustrated in FIG. 2, a plasma P is generated in the chamber 1 by applying the power to the lower electrode 2. For example, an etching gas is supplied through a pipe (not illustrated) connected to the chamber 1. As an etching gas, a gas containing carbon and fluorine (fluorocarbon based gas) may be used. The fluorocarbon based gas may be a gas containing, for example, tetrafluoroethylene ($C_2F_4$). As an etching gas, argon (Ar) may be contained.

In some embodiments, with the generation of the plasma P, a volatile compound is generated by a chemical reaction between activated atoms (radical) in the plasma P and the material in the workpiece film. With the generation of the volatile compound, the workpiece film exposed from the mask is etched, and an opening is formed in the workpiece film. In other words, an opening (hole) same as that of the mask pattern is formed in the workpiece film on the wafer W.

The analysis unit (analyzer) 20 may be a device which performs analysis by an emission spectrography, for example. The analysis unit 20 is an OES (Optical Emission Spectrometry) device, for example. The analysis unit 20 may measure an emission intensity of a product (radical) in the chamber 1 during the plasma etching (that is, while generating the plasma). The analysis unit 20 may calculate the emission intensity from the emission wavelength of the product for example. For example, in a case where the gas containing $C_2F_4$ is used as the etching gas, a $CF_2$ radical and a $C_2$ radical are generated in the chamber 1. The analysis unit 20 may measure the emission intensities from the emission wavelengths of the $CF_2$ radical and the $C_2$ radical, respectively. For example, the emission wavelength of the $CF_2$ radical is 251.8 nm, and the emission wavelength of the $C_2$ radical is 516.5 nm. A unit of the emission intensity is arbitrary.

In some embodiments, the calculation unit 30 is a microprocessor or computer that includes a CPU (Central Processing Unit), for example. The calculation unit 30 may calculate an emission intensity ratio of the product in the chamber 1 based on the emission intensity of each radical measured or calculated by the analysis unit 20. For example, in a case where the gas containing $C_2F_4$ is used as the etching gas, the $CF_2$ radical and the $C_2$ radical may be generated in the chamber 1, and the calculation unit 30 may calculate an emission intensity ratio ($CF_2/C_2$) of the product in the chamber 1.

In some embodiments, the calculation unit 30 may store the device condition of the plasma processing device 100. The calculation unit 30 may store the emission intensity measured or calculated by the analysis unit 20 and the calculated emission intensity ratio. In some embodiments, the plasma processing device 100 may be separately provided with a memory unit which stores the device condition, the emission intensity, and the emission intensity ratio besides the calculation unit 30.

In the plasma processing device 100, a controller (e.g., a microprocessor) (not shown) may be provided to control the operations of the respective elements (for example, the lower electrode 2, the matching device 3, the first power source 4, the second power source 5, and the holding portion 6) in the chamber 1. In this case, the control unit may control the operations of the analysis unit 20 and the calculation unit 30.

In Step S110 of FIG. 1, the device condition of the plasma processing device may correspond to the setting of a parameter which affects on the etching of the insulating film. For example, the device condition of the plasma processing device is setting of the pressure in the chamber to 7 to 20 mTorr. For example, the device condition of the plasma processing device is setting of the power of the first power source 4 of 100 MHz to 800 to 1600 W. For example, the device condition of the plasma processing device corresponds to using the gas containing $C_2F_4$ and Ar as the etching gas.

Next, an etching process starts (Step S120). For example, the power is applied to the lower electrode 2 in the plasma processing device 100.

Next, the plasma is generated (Step S130). For example, the plasma P is generated in the chamber 1 in the plasma processing device 100.

Next, the emission intensity is measured from the emission wavelength of the product during the plasma etching (Step S140). For example, the analysis unit 20 such as an OES device may measure the emission intensity from the emission wavelength of the product in the chamber 1 during the plasma etching. For example, in a case where the gas containing $C_2F_4$ is used as the etching gas, the $CF_2$ radical and the $C_2$ radical may be generated in the chamber 1, and the analysis unit 20 may measure the emission intensities of the $CF_2$ radical and the $C_2$ radical.

Next, the emission intensity of the product is stored (Step S150). For example, the calculation unit 30 may store the emission intensity measured by the analysis unit 20. In some embodiments, a memory unit separately provided in the plasma processing device 100 may store the device condition, the emission intensity, and the emission intensity ratio.

Next, the emission intensity ratio of the product is calculated (Step S160). The calculation unit 30 may calculate the emission intensity ratio of the product in the chamber 1. For example, in a case where the gas containing $C_2F_4$ is used as the etching gas, the $CF_2$ radical and the $C_2$ radical may be generated in the chamber 1, and the calculation unit 30 may calculate the emission intensity ratio ($CF_2/C_2$) of the product.

Next, the description will be given about a relation between the emission intensity ratio of the product and an opening diameter in the mask and the workpiece film.

Figure 3:
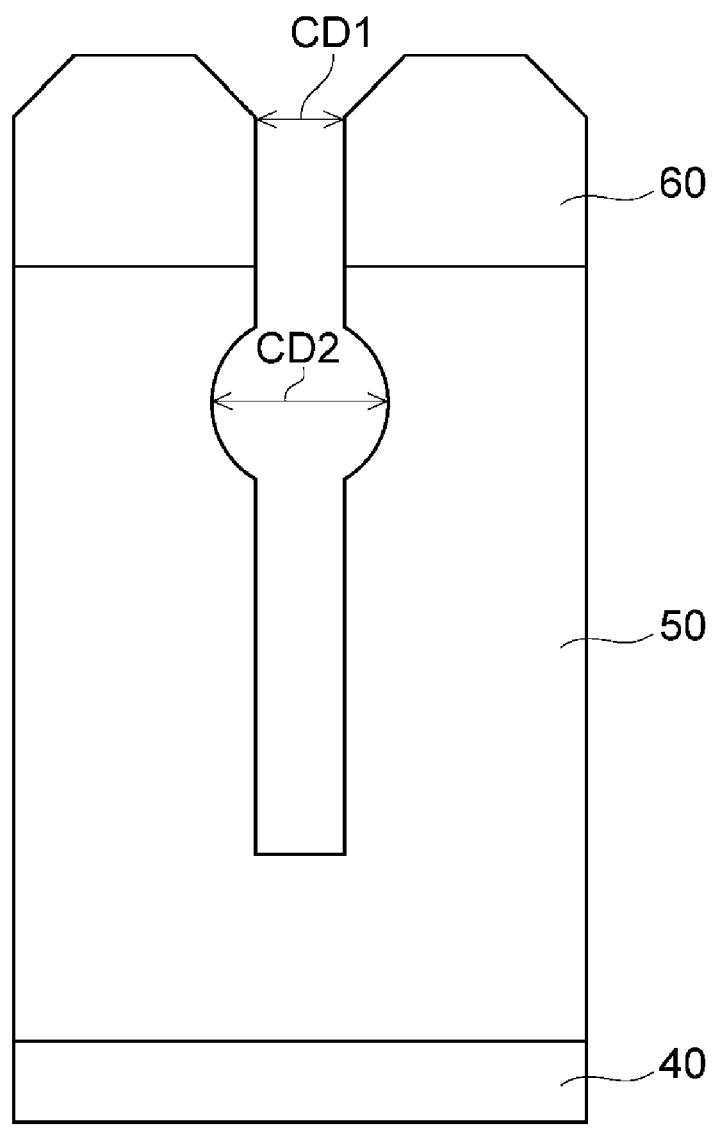
FIG. 3 is a diagram illustrating an opening diameter in a mask and a workpiece film.

FIG. 3 is a diagram illustrating the opening diameter in the mask and the workpiece film.

Figure 4:
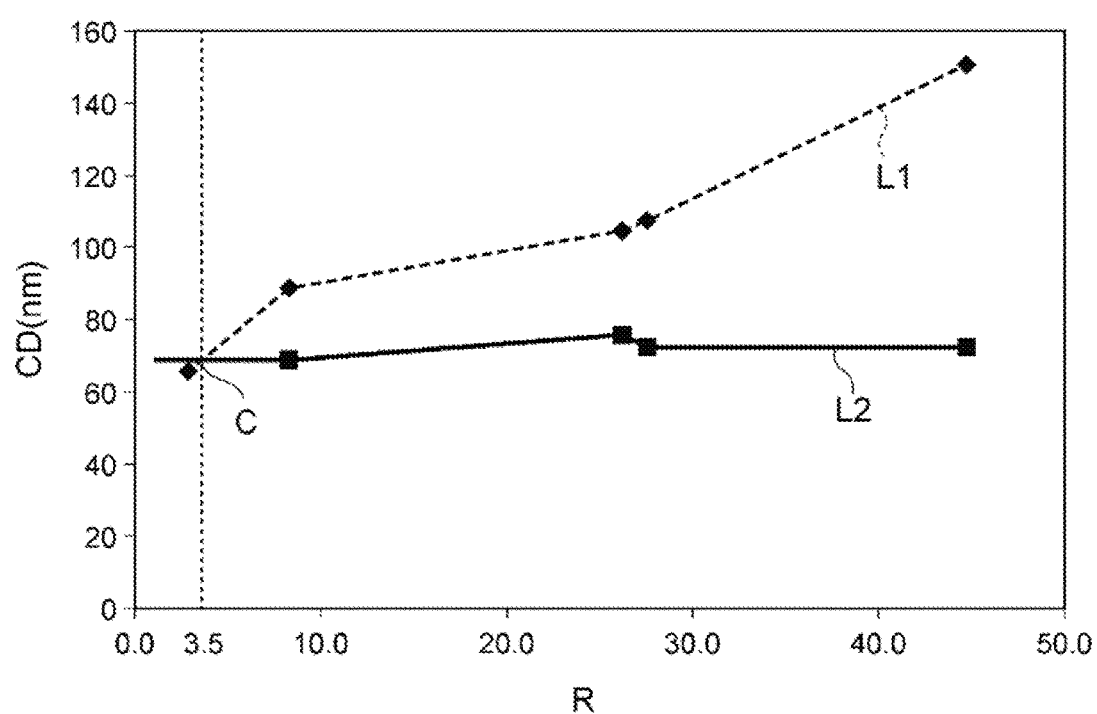
FIG. 4 is a graph illustrating a relation between an emission intensity ratio and the opening diameter.

FIG. 4 is a graph illustrating a relation between the emission intensity ratio and the opening diameter.

As illustrated in FIG. 3, a workpiece film 50 is provided on a substrate 40, and a mask 60 is provided on the workpiece film 50. For example, the substrate 40 is a silicon substrate.

For example, the workpiece film 50 is a silicon oxide film, and the mask 60 is a carbon mask. The diameter of the opening of the mask 60 is, for example, 100 nm. An opening diameter CD1 at an inflection point of a facet of the mask 60 (see FIG. 3) is denoted as TopCD (Top Critical Dimension). A maximum value CD2 of the opening diameter of the hole formed in the workpiece film 50 (see FIG. 3) is denoted as BowCD (Bowing Critical Dimension).

FIG. 4 illustrates a relation between the emission intensity ratio ($CF_2/C_2$) of the product (e.g., a product in the chamber 1 during the plasma etching) and the diameter of the opening in a case where the gas containing $C_2F_4$ is used as the etching gas. The vertical axis and the horizontal axis represent the opening diameter CD (nm) and the emission intensity ratio R, respectively. Line L1 indicates the TopCD of the mask 60 with respect to the emission intensity ratio. Line L2 indicates BowCD of the workpiece film 50 with respect to the emission intensity ratio. In some embodiments, the $C_2$ radical operates in a direction closing the opening of the mask. On the other hand, the $CF_2$ radical is attached to the inner wall of the hole of the workpiece film to protect the inner wall. In other words, the $CF_2$ radical operates to prevent CD2 from being increased (Bowing prevention).

It can be seen from Line L1 of FIG. 4 that TopCD of the mask 60 is increased when the emission intensity ratio R is increased. On the other hand, as can be seen from Line L2 of FIG. 4, BowCD of the workpiece film 50 is substantially constant. The amount of generated $CF_2$ radical is constant with respect to the processing condition, but the amount of generated $C_2$ radical is reduced. Therefore, the emission intensity ratio is increased. In other words, it is considered that BowCD of the workpiece film 50 is substantially constant since TopCD of the mask 60 is widened by the reduction of the $C_2$ radical.

It can be seen from an intersection C of Line L1 and Line L2 of FIG. 4 that the mask 60 is closed by the $C_2$ radical, and CD1<CD2 when the emission intensity ratio R is less than 3.5 (for example, 2.7). When CD1<CD2, there is a concern that an etching rate of the workpiece film is significantly lowered, and a high-perpendicularity hole shape is not secured.

As described above, as can be seen from the intersection C which is an intersection of Line L1 and Line L2 of FIG. 4, BowCD of the hole is substantially constant and the high-perpendicularity hole shape can be formed in the workpiece film 50 when the emission intensity ratio R is equal to or more than 3.5. In other words, when the emission intensity of the $CF_2$ gas is equal to or more than 3.5 times the emission intensity of the $C_2$ gas, the high-perpendicularity hole shape is formed in the workpiece film 50. For example, if a $CF_2$ signal and a $C_2$ signal respectively indicate the emission intensity of the $CF_2$ gas and the $C_2$ gas, the high-perpendicularity hole shape is formed in the workpiece film 50 when the $CF_2$ signal is equal to or more than 3.5 times the $C_2$ signal in the plasma etching.

Figure 5:
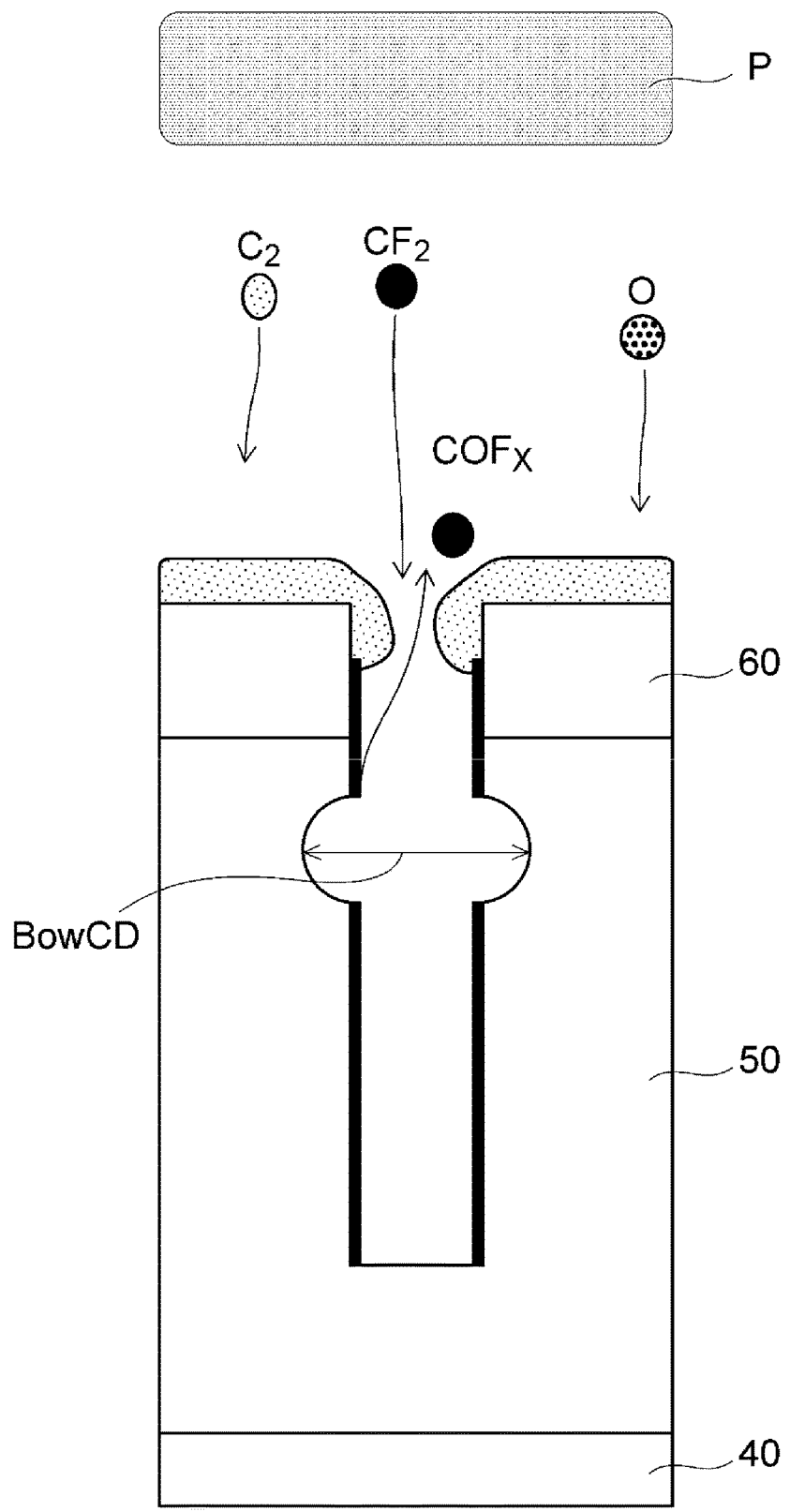
FIG. 5 is a diagram illustrating an etching shape of the workpiece film according to a reference example.

FIG. 5 is a diagram illustrating an etching shape of the workpiece film according to a reference example.

Figure 6:
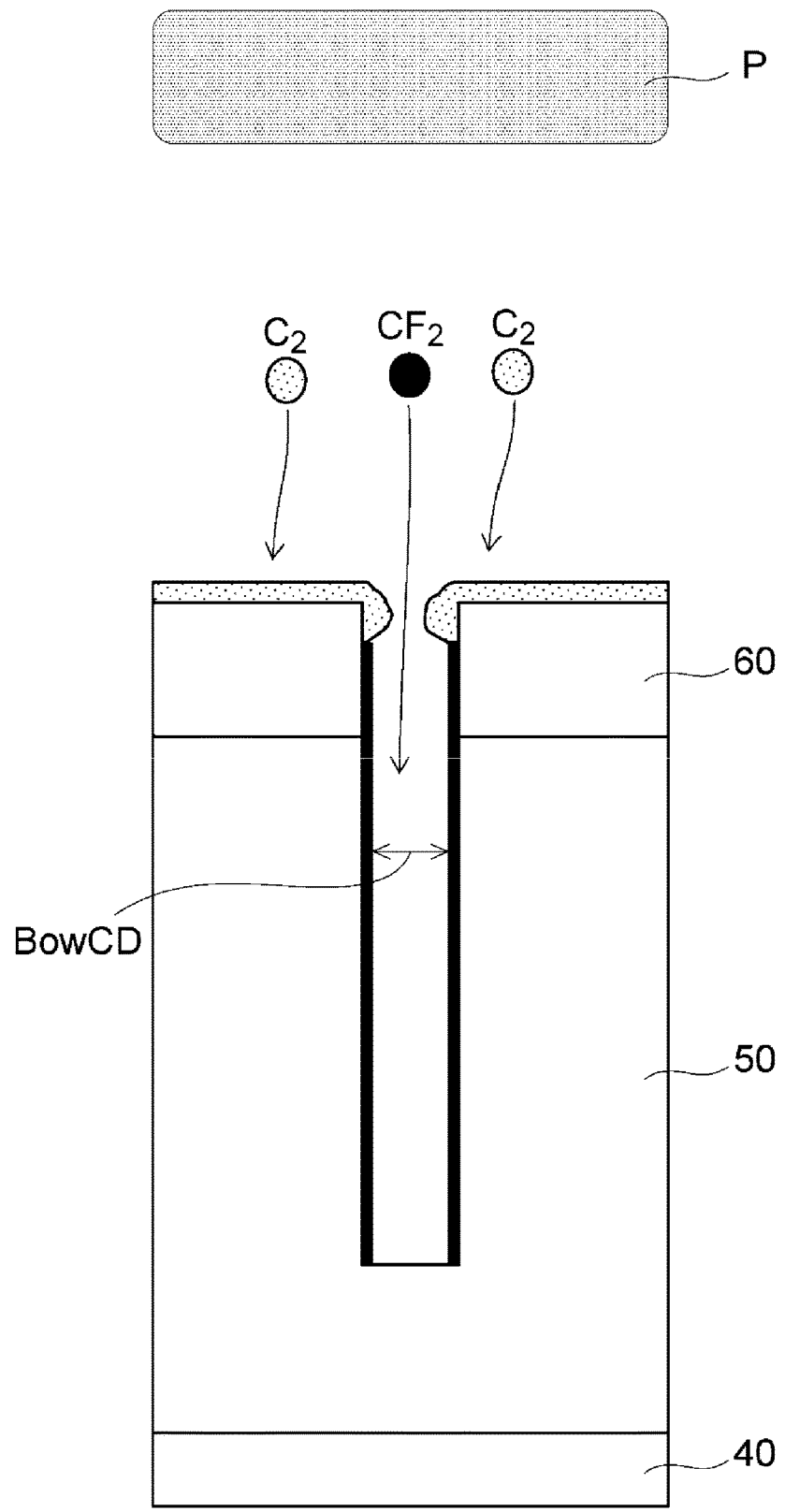
FIG. 6 is a diagram illustrating an etching shape of the workpiece film according to some embodiments.

FIG. 6 is a diagram illustrating an etching shape of the workpiece film according to some embodiments.

As illustrated in FIG. 5, in a case where a groove is formed in the workpiece film 50 by the etching, a gas containing hexafluoro-1,3-butadiene ($C_4F_6$) is used as the etching gas when an aspect ratio of the workpiece film 50 is high. When the $C_4F_6$ gas is used as the etching gas, the $CF_2$ radical and the $C_2$ radical are generated in the chamber 1. The $CF_2$ radical prevents BowCD of the workpiece film 50 from being widened. On the other hand, since the amount of generated $C_2$ is increased due to the closure of the mask 60, the amount of stacked $C_2$ on the mask 60 is reduced and the closure of the mask 60 is prevented by adding $O_2$ gas in the chamber 1.

However, when the $O_2$ gas is added in the chamber 1, $CF_2$ and $O_2$ are chemically reacted to generate $COF_x$. Therefore, there is a concern that because $CF_2$ protecting the inner wall of the groove is removed by the reaction, the amount of stacked $CF_2$ is reduced. As a result, BowCD of the workpiece film 50 is widened, and the perpendicularity of the groove formed in the workpiece film 50 may be lowered.

In the plasma etching method according to some embodiments, the gas containing $C_2F_4$ is used as the etching gas, the emission intensity of the $CF_2$ radical is equal to or more than 3.5 times the emission intensity of the $C_2$ radical while generating the plasma. In this way, when the emission intensity ratio R of $CF_2$ and $C_2$ is equal to or more than 3.5, BowCD of the workpiece film 50 can be substantially constant as illustrated in FIG. 4.

As illustrated in FIG. 6, when the $C_2F_4$ gas is used as the etching gas in some embodiments, it is possible to reduce the amount of generated $C_2$ radical compared to the $C_4F_6$ gas. Therefore, there is no need to add the $O_2$ gas to prevent the mask 60 from being closed, and thus $CF_2$ and $O_2$ are not chemically reacted and no $COF_x$ is generated. Therefore, $CF_2$ protecting the inner wall of the groove is hardly removed, and the amount of stacked $CF_2$ radical can be prevented from being reduced. With this configuration, BowCD of the workpiece film 50 can be prevented from being widened, and the perpendicularity of the groove formed in the workpiece film 50 can be improved.

According to some embodiments (e.g., that illustrated in FIG. 6), it is possible to provide the plasma etching method by which a high-perpendicularity hole can be formed, and the method of fabricating a semiconductor device.

The method of forming an opening in the workpiece film 50 on the substrate 40 using the mask 60 by the plasma etching was described, as an example. The plasma etching method according to the embodiments in the present disclosure may be applied to a method of fabricating a semiconductor device, for example. For example, a memory cell is highly densed and miniaturized in a semiconductor memory device of a three-dimensional structure, and there may be formed a pattern in an insulating film having a high aspect ratio. The exemplary embodiments in the present disclosure may be applied to such a pattern formation. With the configuration, it is possible to prevent BowCD from being widened by increasing selectivity of the mask.

In the plasma etching method according to some embodiments, as described in Steps S140 to S160 of FIG. 1, the analysis unit 20 may measure the emission intensity from the emission wavelength of the product (e.g., a product in the chamber 1 during the plasma etching), and the calculation unit 30 may calculate the emission intensity ratio of the product. Then, as illustrated in FIG. 4, when the emission intensity ratio R is equal to or more than 3.5, a groove having a high perpendicularity can be formed in the workpiece film 50 such that BowCD of the workpiece film 50 is substantially constant without causing $C_2$ to close the mask 60 based on a predetermined device condition (for example, pressure in the chamber, power of the power source, or the type of the etching gas) of the plasma processing device 100. In some embodiments, the plasma etching can be implemented by the emission intensity ratio R which is calculated based on the device condition.

The device condition of the plasma processing device 100 and the emission intensity ratio R calculated by the calculation unit 30 may be adjusted by feeding back after Step S160 of FIG. 1, and then may be applied to the proceeding plasma etching process.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A plasma etching method, comprising:
    performing a plasma etching operation using a gas containing $C_2F_4$,
    wherein while generating plasma, an emission intensity of $CF_2$ generated from $C_2F_4$ is equal to or more than 3.5 times an emission intensity of $C_2$ generated from $C_2F_4$.

2. The plasma etching method according to claim 1, comprising:
    generating plasma; and
    measuring the emission intensity of $CF_2$ and the emission intensity of $C_2$ while generating plasma.

3. The plasma etching method according to claim 2, wherein
    the emission intensity of $CF_2$ and the emission intensity of $C_2$ are measured by an emission spectrography.

4. The plasma etching method according to claim 1, further comprising:
    measuring the emission intensity of $CF_2$ from a wavelength of $CF_2$ radical while generating plasma.

5. The plasma etching method according to claim 1, further comprising:
    measuring the emission intensity of $C_2$ from wavelength of $C_2$ radical while generating plasma.

6. The plasma etching method according to claim 1, wherein the gas used in performing the plasma etching is free of $O_2$.

7. The plasma etching method according to claim 1, further comprising:

controlling one or more device conditions of a plasma processing device to generate plasma such that the emission intensity of $CF_2$ is equal to or more than 3.5 times the emission intensity of $C_2$.

8. The plasma etching method according to claim 7, wherein the one or more device conditions of the plasma include at least one of processing device pressure in a chamber, power of a power source, or a type of an etching gas.

9. A method of fabricating a semiconductor device in which an opening is formed on a workpiece film by a plasma processing device using a gas containing $C_2F_4$, comprising:
   setting a device condition of the plasma processing device;
   generating plasma to etch a mask and the workpiece film in which the mask is provided on an upper surface of the workpiece film; and
   measuring an emission intensity of a product in the plasma processing device while generating plasma,
   wherein while generating plasma, an emmission intensity of $CF_2$ generated from $C_2F_4$ is equal to or more than 3.5 times an emission intensity of $C_2$ generated from $C_2F_4$.

10. The method of fabricating the semiconductor device according to claim 9, wherein
   the emission intensity of the product is measured by an emission spectrography.

11. The method of fabricating the semiconductor device according to claim 9, further comprising:
   calculating an emission intensity ratio of the product in the plasma processing device.

12. The method of fabricating the semiconductor device according to claim 9, further comprising:
   storing the device condition of the plasma processing device and the emission intensity of the product; and
   etching the workpiece film again based on the stored device condition and the stored emission intensity.

13. The method of fabricating the semiconductor device according to claim 9, wherein
   the device condition of the plasma processing device is at least one of pressure in a chamber, power of a high-frequency power source, or a type of an etching gas.

14. The method of fabricating the semiconductor device according to claim 9, wherein
   the workpiece film is a silicon oxide film, and
   the mask is a carbon mask.

15. The method of fabricating the semiconductor device according to claim 9, further comprising:
   measuring the emission intensity of $CF_2$ from wavelength of $CF_2$ radical in the plasma processing device while generating plasma.

16. The method of fabricating the semiconductor device according to claim 9, further comprising:
   measuring the emission intensity of $C_2$ from wavelength of $C_2$ radical in the plasma processing device while generating plasma.

17. The method of fabricating the semiconductor device according to claim 9, wherein the gas used in the plasma processing device is free of $O_2$.

* * * * *